United States Patent
Kushiyama

(10) Patent No.: US 9,112,516 B2
(45) Date of Patent: Aug. 18, 2015

(54) DLL CIRCUIT AND SEMICONDUCTOR DEVICE

(71) Applicant: KABUSHIKI KAISHA TOSHIBA, Minato-ku (JP)

(72) Inventor: Natsuki Kushiyama, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 24 days.

(21) Appl. No.: 14/023,378

(22) Filed: Sep. 10, 2013

(65) Prior Publication Data

US 2014/0132319 A1  May 15, 2014

(30) Foreign Application Priority Data

Nov. 9, 2012 (JP) ................... 2012-247060

(51) Int. Cl.
*H03L 7/06* (2006.01)
*H03L 7/081* (2006.01)

(52) U.S. Cl.
CPC .................... *H03L 7/0814* (2013.01)

(58) Field of Classification Search
None
See application file for complete search history.

(56) References Cited

U.S. PATENT DOCUMENTS

| | | | | |
|---|---|---|---|---|
| 5,087,829 A | * | 2/1992 | Ishibashi et al. | 327/152 |
| 7,132,895 B2 | * | 11/2006 | Roth | 331/1 A |
| 7,492,198 B2 | * | 2/2009 | Suda | 327/158 |
| 7,893,739 B1 | * | 2/2011 | Nagarajan et al. | 327/158 |
| 2009/0195277 A1 | * | 8/2009 | Yamakido et al. | 327/158 |
| 2011/0074477 A1 | * | 3/2011 | Nagarajan et al. | 327/158 |

FOREIGN PATENT DOCUMENTS

| | | |
|---|---|---|
| JP | 2003-58275 A | 2/2003 |
| JP | 2003-218692 A | 7/2003 |
| JP | 2011-049790 A | 3/2011 |

\* cited by examiner

*Primary Examiner* — Lincoln Donovan
*Assistant Examiner* — Khareem E Almo
(74) *Attorney, Agent, or Firm* — White & Case LLP

(57) ABSTRACT

According to one embodiment, a semiconductor device is provided with first to third circuits. The first circuit generates first information that indicates a corresponding relationship between a period of a reference clock and a delay amount per delay element. The second circuit generates second information that indicates the number of stages of delay elements corresponding to a set phase difference based on the first information. The third circuit generates a delayed clock by delaying the reference clock just a delay amount of stages of the delay elements indicating the second information.

9 Claims, 13 Drawing Sheets

DLL CIRCUIT AND SEMICONDUCTOR DEVICE

CROSS REFERENCE TO RELATED APPLICATION

This application is based upon and claims the benefit of priority from the prior Japanese Patent Application No. 2012-247060, filed on Nov. 9, 2012, the entire contents of which are incorporated herein by reference.

FIELD

Embodiments described herein relate to a DLL circuit and a semiconductor device.

BACKGROUND

A semiconductor device that accesses memory devices such as double-data-rate synchronous dynamic random access memories (DDR memory) is provided with a delay locked loop circuit (DLL circuit). The DLL circuit generates a delayed clock having an arbitrary delay with respect to an input clock.

DETAILED DESCRIPTION

Figure 1:
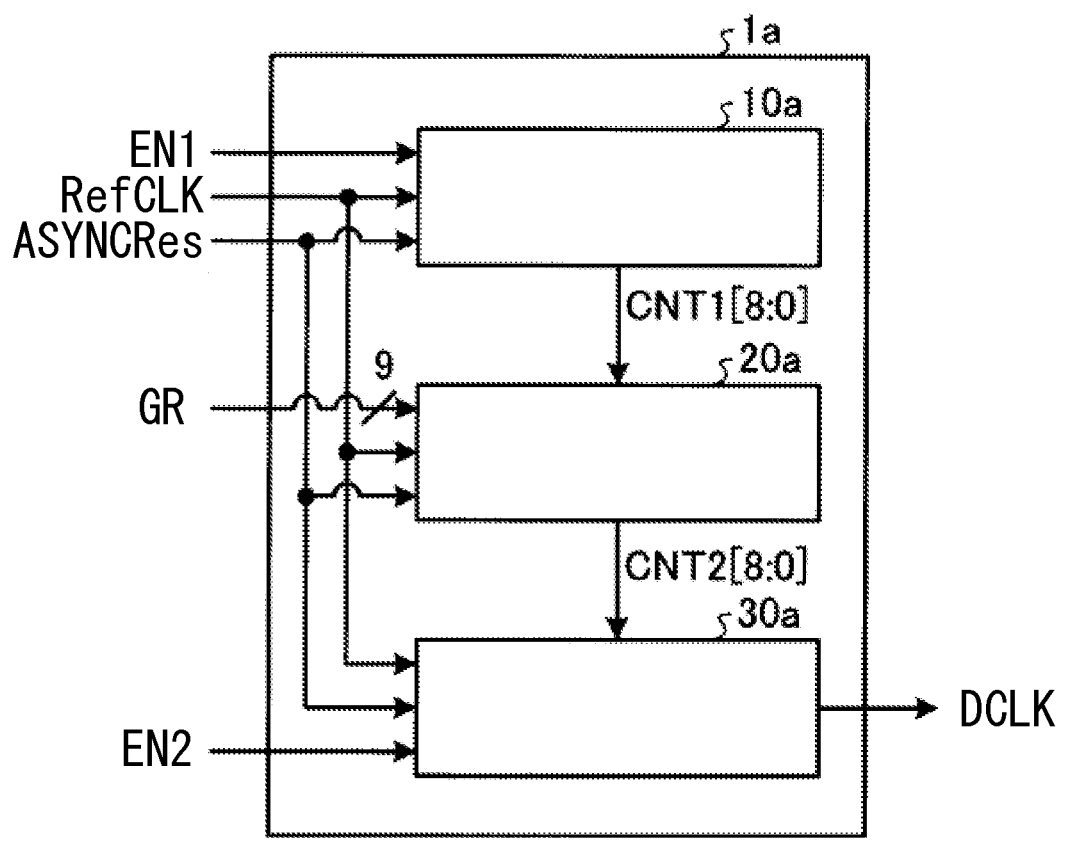
FIG. 1 is a diagram illustrating a configuration of a DLL circuit according to a first embodiment.

According to one embodiment, a semiconductor device is provided with first to third circuits. The first circuit generates first information that indicates a corresponding relationship between a period of a reference clock and a delay amount per delay element. The second circuit generates second information that indicates the number of stages of delay elements corresponding to a set phase difference based on the first information. The third circuit generates a delayed clock by delaying the reference clock just a delay amount of stages of the delay elements indicating the second information.

Hereinafter, a plurality of embodiments will be described with reference to the drawings. In the drawings, the same reference signs indicate the same or similar parts.

A DLL circuit provided in a semiconductor device according to a first embodiment will be described with reference to the drawings. FIG. 1 is a diagram illustrating a configuration of the DLL circuit.

As illustrated in FIG. 1, a DLL circuit 1a includes a first circuit 10a, a second circuit 20a, and a third circuit 30a. The DLL circuit 1a is provided in a semiconductor device that accesses a memory device, and the like. A reference clock RefCLK and an asynchronous reset signal ASYNCRes are respectively input to the first circuit 10a, the second circuit 20a, and the third circuit 30a. An enable signal EN1 is input to the first circuit 10a. An enable signal EN2 is input to the third circuit 30a. The asynchronous reset signal ASYNCRes is a signal that initializes a flip-flop provided to each of the first circuit 10a, the second circuit 20a, and the third circuit 30a. The enable signal EN1 is a signal that specifies whether the first circuit 10a is caused to operate. The enable signal EN2 is a signal that specifies whether the third circuit 30a is caused to operate.

The first circuit 10a measures a delay amount of stages of the delay elements corresponds to the period of the reference clock RefCLK. The first circuit 10a outputs a measurement result to the second circuit 20a as a signal CNT1. The signal CNT1 has, for example, 9-bit resolution (expressed as signal CNT1[8:0]).

A value output from the first circuit 10a as the signal CNT1 (first information) can be defined in any manner as long as the value indicates a relationship between the period of the reference clock RefCLK and the delay amount of the delay element. For example, the value may be the number of stages of the delay elements per time of integral multiples of the period of the reference clock RefCLK, or may be the number of stages of the delay elements per time of the integral divisions of the period of the reference clock RefCLK.

Phase information GR is input to the second circuit 20a. The phase information GR is information specifying the delay amount of a delayed clock DCLK with respect to the reference clock RefCLK in the form of angle information (set phase difference). The phase information GR can be defined in any manner as long as the information indicating a relative relationship between the period of the reference clock RefCLK and a predetermined delay amount. The phase information GR includes, for example, 9-bit resolution (expressed as phase information GR[8:0]). The phase information GR divides the delay amount of one period into 512 equal parts, and expresses a desired amount in a numerical value in a range of 0 to 511.

The second circuit 20a generates the number of stages information corresponding to the delay amount specified by the phase information GR based on the signal CNT1 and the phase information GR. The second circuit 20a outputs a signal CNT2 (second information) to the third circuit 30a. A value output from the second circuit 20a as the signal CNT2 is changed in accordance with the signal CNT1 and the phase information GR.

The third circuit 30a includes a plurality of delay elements. The third circuit 30a causes the reference clock RefCLK to pass through one or more stages of the delay elements. The third circuit 30a generates and outputs the delayed clock DCLK. The number of stages of the delay elements through which the reference clock RefCLK passes in order to generate the delayed clock DCLK is specified by the signal CNT2 output from the second circuit 20a. The signal CNT2 includes, for example, 9-bit resolution (expressed as signal CNT2[8:0]). The signal CNT2 can specify up to 512 stages.

Figure 2:
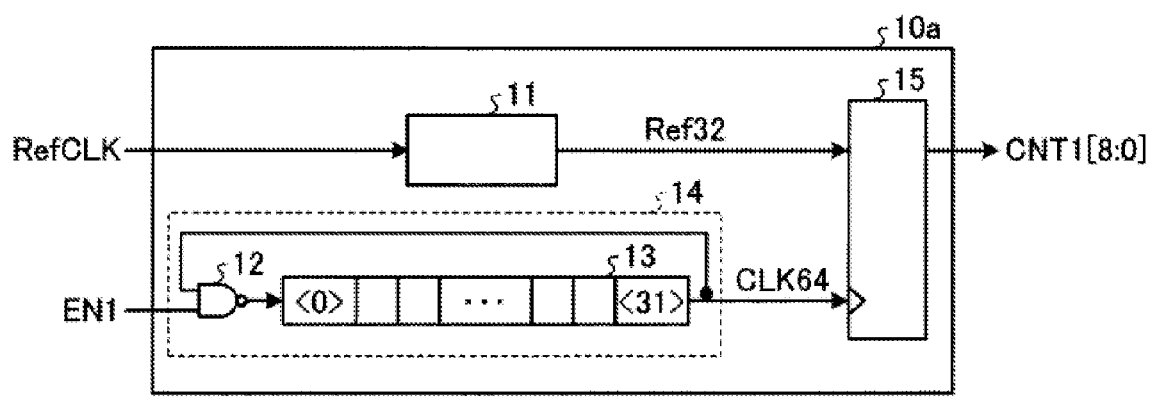
FIG. 2 is a diagram illustrating a configuration of a first circuit according to the first embodiment.
Figure 3:
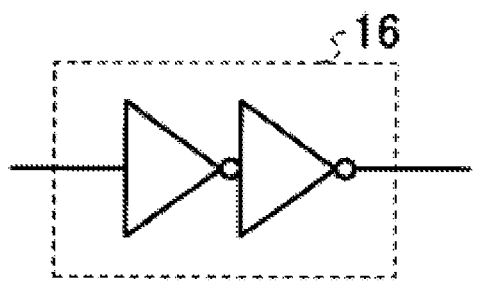
FIG. 3 is a diagram illustrating a configuration example of a delay element that configures a delay line 13 according to the first embodiment.

FIG. 2 is a diagram illustrating a configuration of the first circuit. FIG. 3 is a diagram illustrating a configuration example of the delay element that configures a delay line 13.

As illustrated in FIG. 2, the first circuit 10a includes a frequency divider 11, a ring oscillator 14, and a counter 15. The ring oscillator 14 includes a 2-input NAND circuit 12 and a delay line 13. The delay line 13 has, for example, 32 delay elements connected in series. As illustrated in FIG. 3, each of the 32 delay elements is configured with even number of (here, two) inverters 16 connected in series. In the 2-input NAND circuit 12, a signal output from the delay element 16 at the final stage of the delay line 13 is fed back to a first input side, and the enable signal EN1 is input to a second input side. The 2-input NAND circuit 12 outputs a signal subjected to a logical operation to the delay element 16 at the first stage of the delay line 13. When the enable signal EN1 is High level, the ring oscillator 14 oscillates a clock with a frequency having a time equivalent to approximately 64 stages of the delay amount of the delay elements 16 as the period. The clock (first clock) output from the ring oscillator 14 is expressed in clock CLK64.

The frequency divider 11 divides the frequency of the reference clock RefCLK into 1/32 frequency to generate a clock Ref32 (second clock).

The clock Ref32 and the clock CLK64 are input to the counter 15. The counter 15 counts the clock Ref32 using the clock CLK64 as a clock pulse. To be specific, the counter 15 counts the number of cycles of the clock Ref32 during one pulse period in which the clock CLK64 becomes High level (that is, half the period of the clock CLK64). The counter 15 generates and outputs the signal CNT1 based on a count result.

Figure 4:
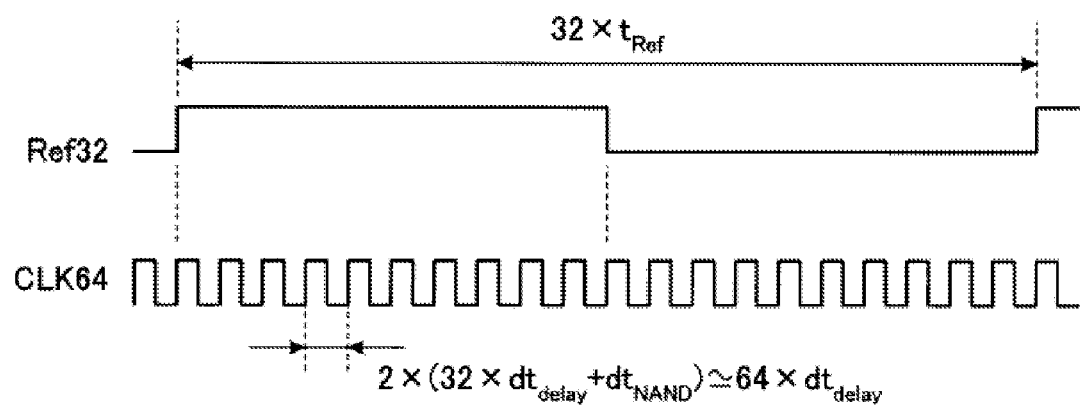
FIG. 4 is a diagram describing a relationship between a clock Ref32 and a clock CLK64 according to the first embodiment.

FIG. 4 is a diagram illustrating a relationship between the clock Ref32 and the clock CLK64. As illustrated in FIG. 4, the count result of the counter 15 is "10". The clock Ref32 has a frequency of 1/32 the reference clock RefCLK. The period of the clock Ref32 is 32×tRef where the period of the reference clock RefCLK is tRef. The period of the clock CLK64 is expressed in 2×{(32×dtdelay)+dtNAND} and in approximately (64×dtdelay) where the delay amount of the delay element 16 is dtdelay, and the delay amount of the 2-input NAND circuit 12 is dtNAND. Therefore, when the count result is "10", the relationship of the following Formula 1 is established:

$$32\times(tRef/2)=64\times dtdelay\times 10 \quad \text{(Formula 1)}$$

When the above Formula 1 is transformed, the following formula is obtained:

$$tRef/dtdelay=40 \quad \text{(Formula 2)}$$

The counter 15 can output the value of "40" as the signal CNT1. It shows the period of the reference clock RefCLK corresponds to the time of the delay amount of 40 delay elements 16.

In the above description, the division ratio of the frequency divider 11 is 32, and the ring oscillator 14 generates the clock CLK64 having a time of 64 times the delay amount of the delay element 16 as the period. The division ratio of the frequency divider 11 and the number of the delay elements 16 that configure the ring oscillator 14 may be arbitrarily set as long as the period of the clock Ref32 is larger than that of the clock CLK64. The division ratio of the frequency divider 11 is A, the number of the delay elements 16 of the ring oscillator 14 is B, and the value of the count result by the counter 15 is C. When a half period of the clock Ref32 is counted by the counter 15, a value to be output as the signal CNT1 can be calculated with the following Formula 3:

$$tRef/dtdelay=2\times B\times(C/A) \quad \text{(Formula 3)}$$

Here, a technology compared with the first embodiment (Comparative Example) will be described. In Comparative Example, the number of stages of the delay elements corresponding to the period of the reference clock RefCLK is measured using a delay line.

Figure 5:
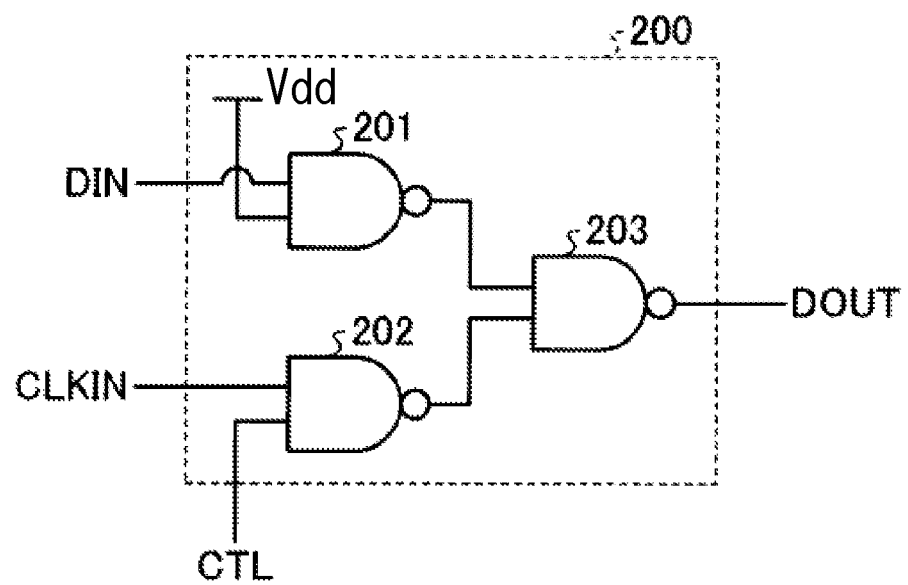
FIG. 5 is a diagram illustrating a delay element of a delay line in Comparative Example according to the first embodiment.

FIG. 5 is a diagram illustrating a configuration example of a delay element that configured the delay line in Comparative Example. The delay line in Comparative Example is connected with a delay element 200 in series. As illustrated in FIG. 5, the delay element 200 includes a 2-input NAND circuit 201, a 2-input NAND circuit 202, and a 2-input NAND circuit 203. An input terminal Din is connected with an output terminal Dout of the delay element 200 at a preceding stage. The reference clock RefCLK is input to a clock input terminal CLKIN. In the 2-input NAND circuit 201, a first input side is connected to the input terminal Din, a second input side is connected to a power source Vdd (set to High level), and a logical operation is performed. In the 2-input NAND circuit 202, a first input side is connected to a clock input terminal CLKIN, a second input side is connected to a control signal terminal CTL, and a logical operation is performed. In the 2-input NAND circuit 203, a signal output from the 2-input NAND circuit 201 is input to a first input side, a signal output from the 2-input NAND circuit 202 is input to a second input side, and a logical operation is performed. The 2-input NAND circuit 203 outputs the signal subjected to the logical operation from the output terminal Dout. When the control signal terminal CTL is High level, the delay element 200 outputs the reference clock RefCLK from the output terminal Dout, and when the control signal terminal CTL is Low level, the delay element 200 outputs an input from the input terminal Din from the output terminal Dout.

That is, in the delay line of Comparative Example, when a High level signal is input to the control signal terminal CTL of only one delay element 200, and a Low level signal is input to the control signal terminals CTL of other delay elements 200, the reference clock RefCLK can pass through all subsequent delay elements 200, treating the only one delay element 200 as a head, which has the control signal terminal CTL into which the High level signal is input.

In Comparative Example, while the reference clock RefCLK having passed through the delay line and the reference clock RefCLK that does not pass through the delay line are compared, a position where a High level signal is input to the control signal terminal CTL is changed. When the both clocks coincide with each other (in other words, a locked state is realized), the number of stages of the delay elements 200 that have been passed through is output as a signal CNT1.

In Comparative Example, the locked state is realized by the reference clock RefCLK having passed through the delay element 200. A minimum operation frequency in accordance with the number of the delay elements 200 that configure the delay line exists in the input clock. For example, when the delay amount per delay element 200 is 25 ps, and when the delay line is configured from 512 delay elements 200, it is necessary that the period of the reference clock RefCLK is less than 25 ps×512=12.8 ns in order to normally realize the locked state. That is, it is necessary that the frequency of the reference clock RefCLK is 78.125 MHz or more. It is necessary to increase the number of the delay elements 200 in the case where the reference clock RefCLK having a frequency smaller than the above frequency is to be treated. When the number of the delay elements 200 is increased, the area of the semiconductor device becomes large, and a leakage current is increased.

In contrast, according to the first embodiment, a value of the signal CNT1 is calculated based on Formula 3. Even when the frequency of the reference clock RefCLK is small, merely a value C obtained as a count result by the counter 15 becomes large, and the value of the signal CNT1 can be calculated. That is, in the first embodiment, a combination of the frequency divider 11 and the ring oscillator 14 can remove the minimum operation frequency.

As can be understood from Formula 3 in the first embodiment, even when the number of the delay elements that configure the ring oscillator 14 is small, merely the value C that is a count result by the counter 15 becomes large, and the value of the signal CNT1 can be calculated. The first embodiment can reduce the number of delay elements than Comparative Example. That is, in the first embodiment, the scale of the semiconductor device in which the DLL circuit is included can be reduced compared with that in Comparative Example.

Figure 6:
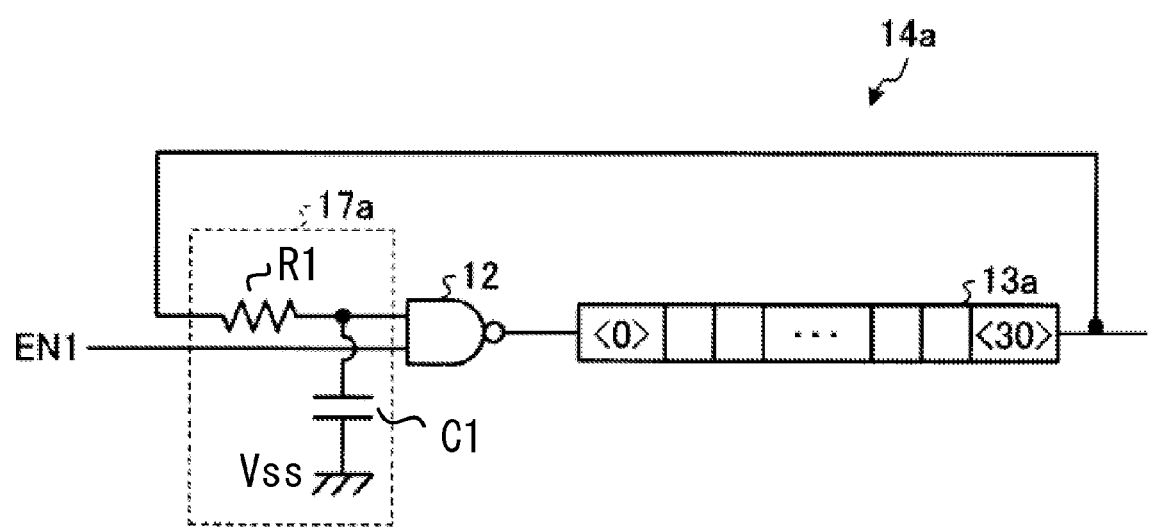
FIG. 6 is a diagram illustrating another configuration example of a ring oscillator according to the first embodiment.
Figure 7:
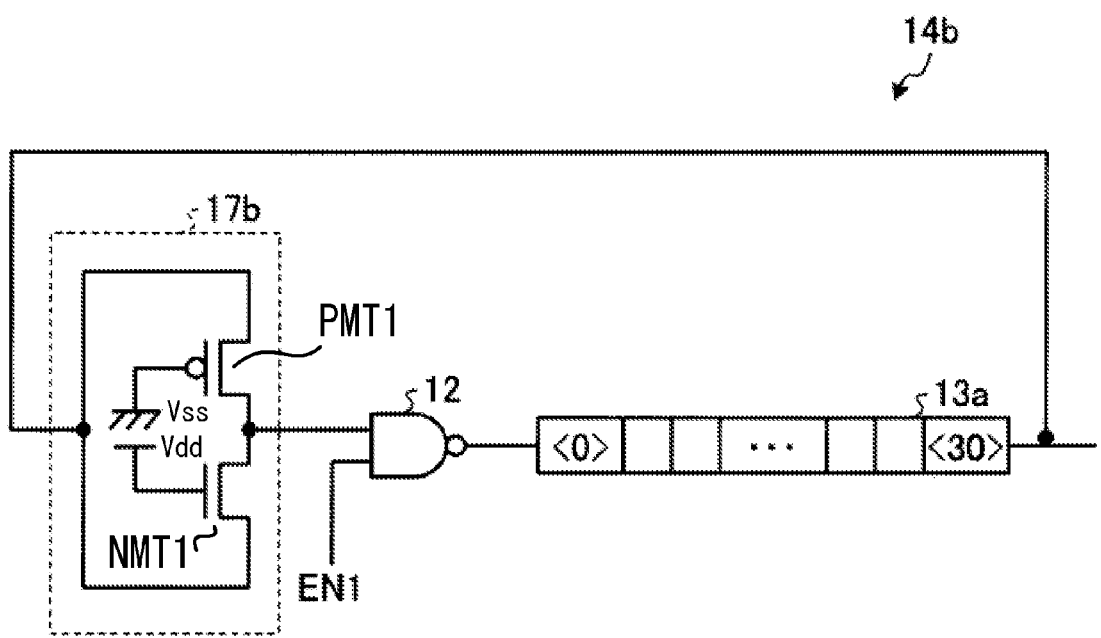
FIG. 7 is a diagram illustrating another configuration example of the ring oscillator according to the first embodiment.

In the above description, the period of the clock CLK64 output from the ring oscillator 14 is 2×{(32×dtdelay)+dtNAND}. To accurately match the period of the clock CLK64 with 64×dtdelay, the configuration of the ring oscillator 14 may be transformed. FIGS. 6 and 7 are diagrams illustrating a modification of the ring oscillator 14.

As illustrated in FIG. 6, a ring oscillator 14a includes a 2-input NAND circuit 12, a delay line 13a, and a delay element 17a. The delay line 13a is configured from 31 delay elements connected in series. The delay element 17a includes a resistor R1 and a capacitor C1. The resistor R1 has one end connected to an output side of the delay line 13a and the other end connected to a first input side of the 2-input NAND circuit 12. The capacitor C1 has one end connected to the other end of the resistor R1 and the other end connected to a ground voltage Vss. In the 2-input NAND circuit 12, a signal obtained by delaying an output signal of the delay line 13a by a predetermined time by the delay element 17a is fed back to the first input side, and an enable signal EN1 is input to a second input side. The 2-input NAND circuit 12 outputs a signal subjected to a logical operation to the delay element of the delay line 13a at a first stage. A resistance value of the resistor R1 and a capacity value of the capacitor C1 are set so that a sum of the delay amount of the delay element 17a and a delay amount dtNAND of the 2-input NAND circuit 12 is equal to the delay amount of one delay element. With this setting, the ring oscillator 14a can oscillate a clock CLK64 having a period that coincides with 64×dtdelay.

As illustrated in FIG. 7, a ring oscillator 14b includes the 2-input NAND circuit 12, the delay line 13a, and a delay element 17b. The delay line 13a is configured from 31 delay elements connected in series. The delay element 17b is provided with a P-channel MOS transistor PMT1 and an N-channel MOS transistor NMT1. The P-channel MOS transistor PMT1 has one end (source) connected to an output side of the delay line 13a, and a control terminal (gate) connected to the ground voltage Vss, and the other end (drain) connected to a first input side of the 2-input NAND circuit 12. The N-channel MOS transistor NMT1 has one end (drain) connected to a first input side of the 2-input NAND circuit 12, and a control terminal (gate) connected to the power source Vdd (set to High level), and the other end (source) connected to an output side of the delay line 13a. An output signal of the delay element 17b is input to a first input side of the 2-input NAND circuit 12. An enable signal EN1 is input to a second input side of the 2-input NAND circuit 12. The 2-input NAND circuit 12 outputs a signal subjected to a logical operation to the delay element of the delay line 13a at a first stage. Characteristics of the P-channel MOS transistor PMT1 and the N-channel MOS transistor NMT1 are set so that a sum of the delay amount of the delay element 17b and a delay amount dtNAND of the 2-input NAND circuit 12 is equal to the delay amount of one delay element. With this setting, the ring oscillator 14b can oscillate a clock CLK64 having a period that coincides with 64×dtdelay.

In the above description, the reference clock RefCLK is input to the first circuit 10a and the third circuit 30a. However, any clock may be input to the third circuit 30a as long as the clock has the same frequency as the reference clock RefCLK. When a clock different from the reference clock RefCLK is input, the third circuit 30a can generate the delayed clock DCLK based on the input clock.

As described above, in the embodiment, the DLL circuit 1a includes the first circuit 10a, the second circuit 20a, and the third circuit 30a. The first circuit 10a includes the frequency divider 11, the ring oscillator 14, and the counter 15. The ring oscillator 14 generates the clock CLK64 having a time equivalent to predetermined times the delay amount of the delay element 16 as the period. The frequency divider 11 divides the frequency of the reference clock RefCLK at a predetermined division ratio to generate the clock Ref32 having a period larger than the clock CLK64. The counter 15 counts the pulse of the clock Ref32 using the clock CLK64 as a clock pulse. The first circuit 10a generates the information that indicates the corresponding relationship between the period of the reference clock RefCLK and the delay amount per delay element 16 based on the count result by the counter 15.

Therefore, compared with Comparative Example, the number of the delay elements 16 can be decreased, and the scale of the semiconductor device with the DLL circuit 1a can be decreased.

Note that, in the embodiment, the delay element 16 illustrated in FIG. 3 has been used as the delay element, the delay element is not necessarily limited to the delay element 16. For example, the delay element 200 illustrated in FIG. 5 may be used. By connecting the control signal terminal CTL input to the delay element 200 with the ground voltage Vss, a signal delayed by two 2-input NAND circuits with respect to the signal input to the input terminal Din can be output from the output terminal Dout.

Figure 8:
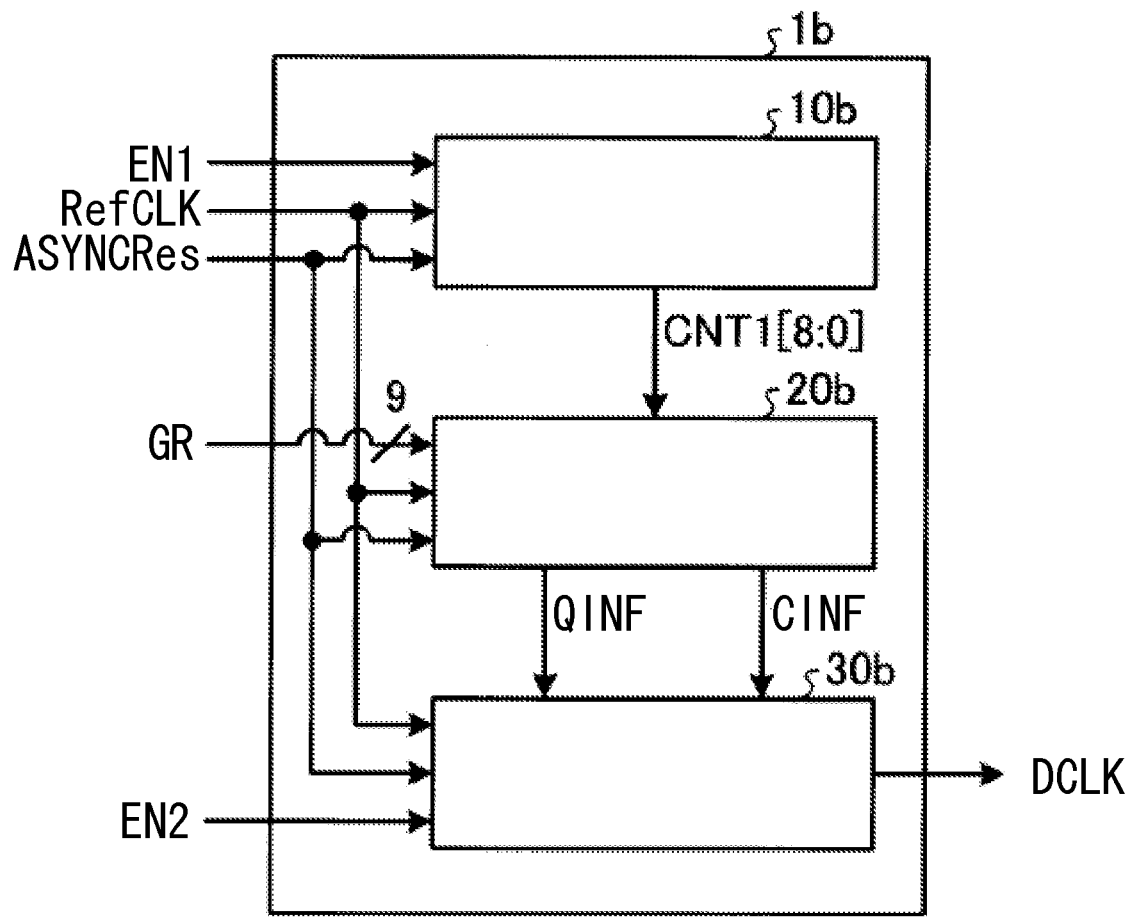
FIG. 8 is a diagram illustrating a configuration of a DLL circuit according to a second embodiment.

A DLL circuit provided in a semiconductor device according to a second embodiment will be described with reference to the drawings. FIG. 8 is a diagram illustrating a configuration of a DLL circuit.

As illustrated in FIG. 8, a DLL circuit 1b includes a first circuit 10b, a second circuit 20b, and a third circuit 30b. Reference clock RefCLK and asynchronous reset signal ASYNCRes are respectively input to the first circuit 10b, the second circuit 20b, and the third circuit 30b. An enable signal EN1 is input to the first circuit 10b. An enable signal EN2 is input to the third circuit 30b. The asynchronous reset signal ASYNCRes is a signal that initializes a flip-flop provided to each of the first circuit 10b, the second circuit 20b, and the third circuit 30b. The enable signal EN1 is a signal that specifies whether or not the first circuit 10b operates. The enable signal EN2 is a signal that specifies whether or not the third circuit 30b operates.

The first circuit 10b measures the delay amount of how many stages of the delay elements corresponds to the period of the reference clock RefCLK. The first circuit 10b outputs a measurement result to the second circuit 20b as a signal CNT1. Note that, to reduce the number of delay elements of the first circuit 10b, the first circuit 10a of the first embodiment can be used as the first circuit 10b.

Phase information GR is input to the second circuit 20b. The second circuit 20b generates and outputs quotient information QINF and remainder information CINF based on values of the phase information GR and the signal CNT1. The quotient information QINF and the remainder information CINF will be described below.

The third circuit 30b generates and outputs a delayed clock DCLK obtained by delaying the reference clock RefCLK by a delay amount corresponding to the phase information GR based on the quotient information QINF and the remainder information CINF generated by the second circuit 20b.

Figure 9:
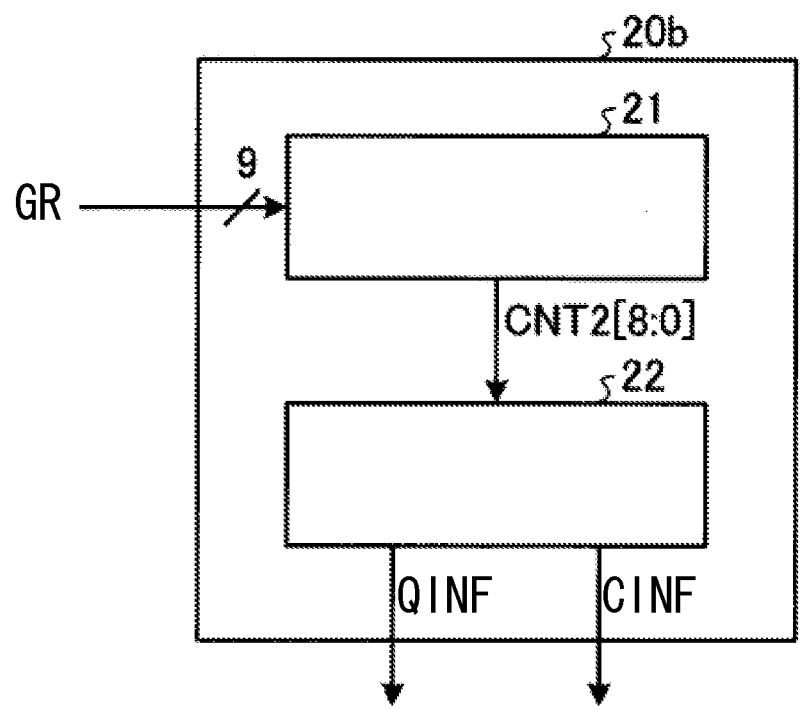
FIG. 9 is a diagram illustrating a configuration of a second circuit according to the second embodiment.

FIG. 9 is a diagram illustrating a configuration of a second circuit. As illustrated in FIG. 9, the second circuit 20b includes a phase information conversion circuit 21 and a division circuit 22. The phase information conversion circuit 21 generates and outputs a signal CNT2 similarly to the second circuit 20a of the first embodiment. The division circuit 22 divides a value output as the signal CNT2 by a predetermined value, for example, by "64", and outputs obtained quotient as the quotient information QINF and obtained remainder as the remainder information CINF, respectively. Grounds for the value "64" used in a division in the division circuit 22 will be described below.

Figure 10:
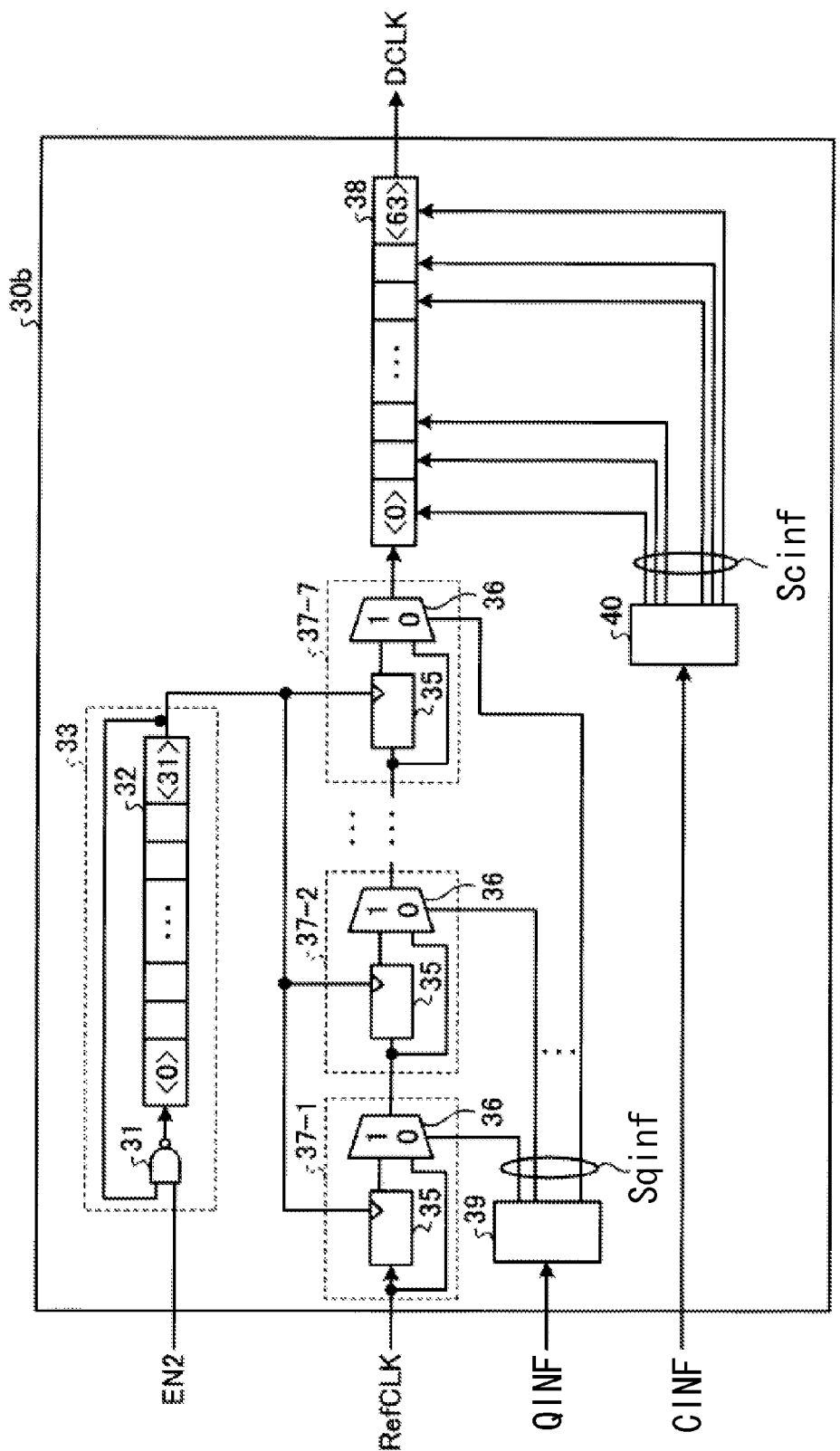
FIG. 10 is a diagram illustrating a configuration of a third circuit according to the second embodiment.

FIG. 10 is a diagram illustrating a configuration of a third circuit. As illustrated in FIG. 10, the third circuit 30b includes a ring oscillator 33, unit elements 37-1 to 37-7, a delay line 38, a decoder 39, and a decoder 40. Note that, hereinafter, any element from the unit elements 37-1 to 37-7 may be expressed as a unit element 37.

The ring oscillator 33 includes a 2-input NAND circuit 31 and a delay line 32. The delay line 32 has 32 delay elements connected in series. The 32 delay elements use a configuration in which the delay element 16 illustrated in FIG. 3 and the delay element 200 having the control signal terminal CTL illustrated in FIG. 5 connected with the ground voltage Vss are connected in series, for example. A first input side of the 2-input NAND circuit 31 is connected to an output side of the delay line 32. The enable signal EN2 is input to a second input side of the 2-input NAND circuit 31. The 2-input NAND circuit 31 outputs a signal subjected to a logical operation to an input side of the delay line 32. When the enable signal EN2 is High level, the ring oscillator 33 oscillates and outputs a clock with a frequency having a time equivalent to approximately 64 stages of the delay amount of the delay elements as the period. Note that the ring oscillator 33 may be configured to have a similar configuration to the ring oscillator 14a and the ring oscillator 14b of the first embodiment, where the period of the clock oscillated by the ring oscillator 33 may be further approximated to the time equivalent to the 64 stages of the delay amount of the delay elements.

Seven unit elements 37-1 to 37-7 are connected in series having the unit elements 37-1 to which the reference clock RefCLK is input as a head. Each of the unit elements 37-1 to 37-7 are provided with shift register 35 and multiplexer 36. The unit element 37 selects whether outputting a signal input from the unit element 37 at a preceding stage to the unit element 37 at a subsequent stage through the shift register 35 or directly outputting the signal to the unit element 37 at the subsequent stage without through the shift register 35, by the signal input to a selection signal terminal of the multiplexer 36. An output of the ring oscillator 33 is input to each clock input terminal of the shift register 35 of the unit element 37, and is used as a trigger clock of the shift register 35. When a pass to be output to the subsequent stage through the shift register 35 is selected, the unit element 37 delays the input signal by the time equivalent to the 64 stages of the delay amount of the delay elements, and outputs the signal to the subsequent stage. When "1 (High level)" is input to the selection signal terminal, for example, the multiplexer 36 selects a pass through the shift register 35. When "0 (Low level)" is input to the selection signal terminal, the multiplexer 36 selects a pass bypassing the shift register 35.

64-stage delay elements are connected in series to configure the delay line 38. The delay element composed of the delay line 38 has the same configuration as the delay element 200 illustrated in FIG. 5. An output of unit elements 37-7 is input to a clock input terminal CLKIN of a delay element 200 of the delay line 38. A signal of an output terminal Dout of the delay element 200 at a preceding stage is input to an input terminal Din of the delay element 200. The delay line 38 changes the number of the delay elements 200 through which an output of the unit elements 37-7 passes in a range of 1 to 64 according to a position in which the High level is input to the control signal terminal CTL. A delayed clock DCLK is output from the final stage of the delay line 38.

By configuring the unit element 37 and the delay line 38 as described above, a delay amount dttotal of the delayed clock DCLK with respect to the reference clock RefCLK is given in the following Formula 4, where the number of the unit elements 37 in which a pass that passes through the shift registers 35 of the unit elements 37-1 to 37-7 is selected is D, the number of the delay elements 200 through which the clock signal passes in the delay line 38 is E, and the delay amount of the delay elements 200 is dtdelay. Here, it is assumed that the delay element of the delay line 32 and the delay element of the delay line 38 have approximately the same delay amount.

$$d\text{ttotal} = \{(64 \times D) + E\} \times D\text{tdelay} \quad \text{(Formula 4)}$$

As described above, the third circuit 30b includes the delay line 38 and the seven unit elements 37. The delay line 38 includes 64 delay elements 200. The seven unit elements 37 delays the delay amount per delay element 200 in units of 64 stages. Therefore, the delay amount dttotal can be adjusted in a range of (1×dtdelay) to (512×dtdelay) without providing with 512 delay elements 200. That is, the DLL circuit 1b of the embodiment can generate the delayed clock DCLK using a small number of delay elements 200.

Here, the quotient information QINF output from the division circuit 22 is used as information specifying the above-described value D, and the remainder information CINF is used as information specifying the above-described value E. "64" is set as a value used by the division circuit 22 for a division on the basis that the unit element 37 can delay the delay amount per delay element 200 in units of 64 stages. That is, the value used by the division circuit 22 for a division is set according to how many delay amounts of the delay elements 200 corresponding to the period of the clock oscillated by the ring oscillator 33.

The decoder 39 outputs seven quotient information signals Sqinf according to the quotient information QINF. The seven quotient information signals Sqinf transmit 1-bit information, respectively. The seven quotient information signals Sqinf are input to different selection signal terminals of the multiplexers 36 of the unit elements 37, respectively. The decoder 39 decodes the quotient information QINF, and outputs the quotient information signals Sqinf, the number of which is equal to the value D input as the quotient information QINF, as "1".

The decoder 40 outputs 64 remainder information signals Scinf according to the remainder information CINF. The 64 remainder information signals Scinf transmit 1-bit information, respectively. The 64 remainder information signals Scinf are input to the control signal terminals CTL of the 64 delay elements 200 that configure the delay line 38, respectively. The decoder 40 decodes the value E input as the remainder information CINF, causes the remainder information signal Scinf connected to the control signal terminal CTL of the delay element 200 at the (65−E)th stage from the head to be High level, and causes other remainder information signal Scinf to be Low level.

Although the division circuit 22 is provided in the second circuit 20b in the above description, the configuration is not limited to this example. For example, the division circuit 22 may be provided in the third circuit 30b. Similarly, the decoder 39 and the decoder 40 may be provided at arbitrary positions.

As describe above, in the embodiment, the DLL circuit 1b includes the first circuit 10b, the second circuit 20b, and the third circuit 30b. The second circuit 20b includes the phase information conversion circuit 21 and the division circuit 22. The division circuit 22 divides the number of stages of the delay element 200 for realizing the delay amount of the set phase difference GR by the set number of stages to output a quotient and a remainder. The third circuit 30b includes the ring oscillator 33, the unit elements 37-1 to 37-7, the delay line 38, the decoder 39, and the decoder 40. The ring oscillator 33 generates a clock having the delay amount of the set number of stages of the delay elements 200 as a period. The shift register 35 of the unit element 37 delays the input signal using the clock generated by the ring oscillator 33 as a trigger clock. The DLL circuit 1b passes the reference clock RefCLK through the shift registers 35 having the same number as the quotients calculated by the division circuit 22 and the delay elements 200 having the same number as the reminders calculated by the division circuit 22 in series to generate the delayed clock DCLK.

Therefore, the delayed clock DCLK can be generated using a small number of delay elements 200, whereby the scale of the semiconductor device with the DLL circuit 1b can be decreased.

Figure 11:
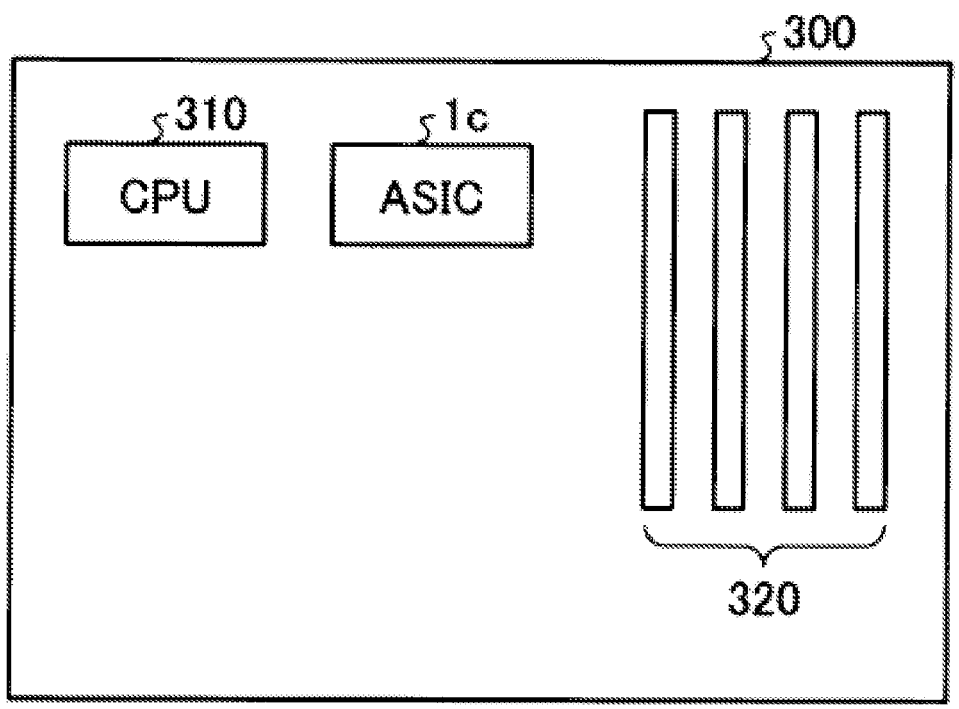
FIG. 11 is a top view of a motherboard according to a third embodiment.

A semiconductor device according to a third embodiment will be described with reference to the drawings. FIG. 11 is a top view of a motherboard. In the embodiment, an application specific integrated circuit (ASIC) as a semiconductor device that accesses a DDR memory is provided.

Hereinafter, configuration elements similar to the configuration elements described in the first embodiment will be denoted with the same names and reference signs as the first embodiment, and overlapped description is omitted.

As illustrated in FIG. 11, a motherboard 300 is provided with a central processing unit (CPU) 310, an ASIC 1c, and a DDR memory 320. The CPU 310 issues an access instruction to the DDR memory 320. The ASIC 1c obtains a physical address of an access destination based on the access instruction issued by the CPU 310, and executes an access to the obtained physical address.

Figure 12:
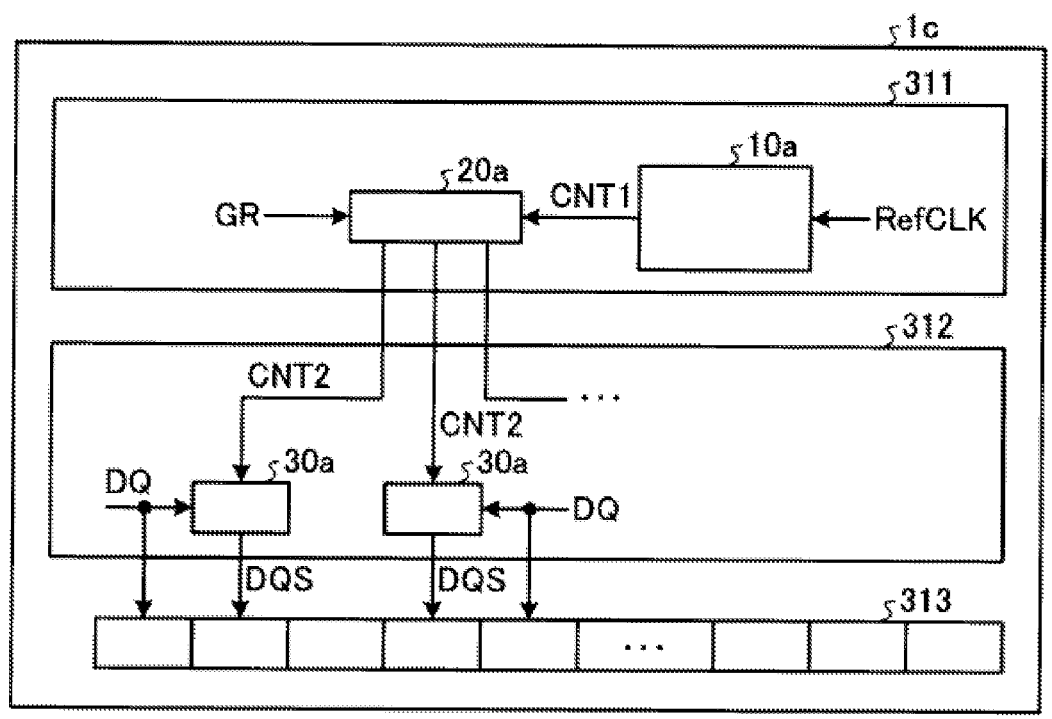
FIG. 12 is a diagram illustrating a configuration of ASIC according to the third embodiment.

FIG. 12 illustrates a block diagram illustrating a configuration of an ASIC. As illustrated in FIG. 12, the ASIC 1c includes a memory controller 311, a logic circuit 312, and a plurality of I/O terminal groups 313. The memory controller 311 includes a first circuit 10a and a second circuit 20a. The logic circuit 312 is provided with a plurality of (here, two) third circuits 30a. DQ signals having the same frequency as the reference clock RefCLK are respectively supplied to the two third circuits 30a. The two third circuits 30a respectively generates DQS signals that are obtained by delaying the DQ signals just a delay amount specified based on phase information. Each of the DQ signal and the DQS signals is input to each of corresponding predetermined terminals of the I/O terminal group 313.

The first circuit 10a is realized in a smaller scale than the comparative example. Therefore, the scale of the memory controller 311 can be reduced compared with that of the comparative example. In addition, a leakage current can be reduced.

Note that, in the embodiment, a case has been described, in which the first circuit 10a, the second circuit 20a, and the third circuit 30a of the first embodiment are applied to the ASIC 1c. However, the first circuit 10b, the second circuit 20b, and the third circuit 30b of the second embodiment may be applied to the ASIC 1c. When the first circuit 10b, the second circuit 20b, and the third circuit 30b of the second embodiment are applied to the ASIC 1c, the scale of the logic circuit 312 can be reduced. In addition, a leakage current of the logic circuit 312 can be reduced.

Figure 13:
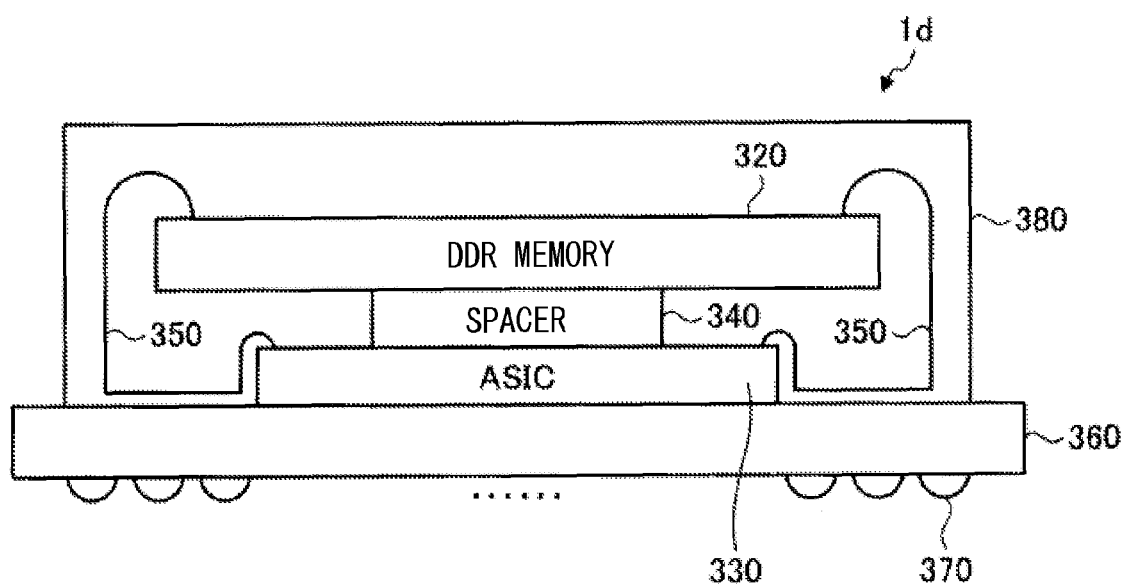
FIG. 13 is a cross-sectional view of a memory chip according to a fourth embodiment.

A semiconductor device according to a fourth embodiment will be described with reference to the drawing. FIG. 13 is a cross-sectional view of a memory chip. The embodiment is applied to a memory chip of a DDR memory. Hereinafter, configuration elements similar to the configuration elements described in the third embodiment will be denoted with the same names and reference signs as the third embodiment, and overlapped description is omitted.

As illustrated in FIG. 13, in a memory chip 1d, an ASIC 330, a spacer 340, and a DDR memory 320 are formed and stacked. The ASIC 330 is provided on a substrate 360, and has a similar configuration to the ASIC 1c of the third embodiment.

The ASIC 330 and the DDR memory 320 are electrically connected through bonding wires 350. Bonding wires 350 are connected to a corresponding terminal from among an I/O terminal group 313 on a first principal surface side of the ASIC 330. The ASIC 330, the spacer 340, the DDR memory 320, and the bonding wires 350 are sealed with a mold resin 380. A plurality of solder balls 370 is provided on a back surface side of the substrate 360. The solder ball 370 is electrically connected to a corresponding terminal from among the I/O terminal group of the ASIC 330 through a via (not illustrated) that penetrates the substrate 360.

As described above, in the embodiment, the ASIC 330 has a similar configuration to the ASIC 1c of the third embodiment, whereby the scale of the memory chip 1d can be reduced. In addition, a leakage current can be reduced.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
  a first circuit to generate first information indicating a corresponding relationship between a period of a reference clock and a delay amount per delay element;
  a second circuit to generate second information indicating the number of stages of the delay elements corresponding to a set phase difference based on the first information; and a third circuit to generate a delayed clock by delaying the reference clock just a delay amount of stages of the delay elements indicating the second information, wherein the first circuit includes a ring oscillator, a frequency divider, and a counter, the ring oscillator generates a first clock having a delay amount of one or more of the delay elements as a period, the frequency divider divides a frequency of the reference clock to generate a second clock having a larger period than the first clock, and the counter counts the period of the second clock using the first clock as a clock pulse, and wherein the first circuit generates the first information based on a count result by the counter.

2. The semiconductor device according to claim 1, wherein the delay element is configured from an even number of inverters connected in series.

3. The semiconductor device according to claim 1, wherein the ring oscillator includes a 2-input NAND circuit and a delay line, the delay line has n delay elements connected in series (n is an integer of 2 or more), and outputs the first clock from an nth delay element, and the 2-input NAND circuit has a first input side into which the first clock is fed back and a second input side into which a first enable signal is input, and outputs a signal subjected to a logical operation to a first delay element of the delay line.

4. The semiconductor device according to claim 1, wherein the ring oscillator includes a 2-input NAND circuit, a delay line, and a first delay element, the delay line has (n-1) delay elements connected in series (n is an integer of 2 or more), and outputs the first clock from an (n-1)th delay element, the first delay element includes a resistance and a capacitor, the resistance has one end into which the first clock is fed back, the capacitor has one end connected to the other end of the resistance, and the other end connected to a ground voltage, and the 2-input NAND circuit has a first input side connected to the other end of the resistance and a second input side into which a first enable signal is input, and outputs a signal subjected to a logical operation to a first delay element of the delay line.

5. The semiconductor device according to claim 1, wherein the ring oscillator includes a 2-input NAND circuit, a delay line, and a second delay element, the delay line includes (n-1) delay elements connected in series (n is an integer of 2 or more), and outputs the first clock from an (n-1)th delay element, the second delay element includes a P-channel MOS transistor and an N-channel MOS transistor, the P-channel MOS transistor has a source into which the first clock is fed back, and a gate connected to a ground voltage, the N-channel MOS transistor has a drain connected to a drain of the P-channel MOS transistor, a gate connected to a power source, and a source into which the first clock is fed back, and the 2-input NAND circuit has a first input side connected to a drain of the P-channel MOS transistor and a second input side into which a first enable signal is input, and outputs a signal subjected to a logical operation to a first delay element of the delay line.

6. A semiconductor device comprising:

a first circuit to generate first information indicating a corresponding relationship between a period of a reference clock and a delay amount per delay element;

a second circuit to generate quotient information and remainder information based on phase information and the first information; and a third circuit to generate a delayed clock by delaying the reference clock just a delay amount corresponding to the phase information based on the quotient information and the remainder information, wherein the first circuit includes a ring oscillator, a frequency divider, and a counter, the ring oscillator generates a first clock having the delay amount of one or more delay elements as a period, the frequency divider divides a frequency of the reference clock to generate a second clock having a larger period than the first clock, and the counter counts the period of the second clock using the first clock as a clock pulse, and wherein the first circuit generates the first information based on a count result by the counter.

7. The semiconductor device according to claim 6, wherein the second circuit includes a phase information conversion circuit and a division circuit, the phase information conversion circuit generates second information indicating the number of stages of the delay element corresponding to a set phase difference based on the first information, and the division circuit divides a value of the second information by a predetermined value, treats an obtained quotient as the quotient information, and treats an obtained remainder as the remainder information.

8. A semiconductor device comprising:

a first circuit to generate first information indicating a corresponding relationship between a period of a reference clock and a delay amount per delay element;

a second circuit to generate quotient information and remainder information based on phase information and the first information; and a third circuit to generate a delayed clock by delaying the reference clock just a delay amount corresponding to the phase information based on the quotient information and the remainder information, wherein the third circuit includes a ring oscillator, a plurality of unit elements connected in series, a delay line, a first decoder, and a second decoder, each of the plurality of unit elements includes a shift register and a multiplexer, the reference clock is input to a first unit element among the plurality of unit elements, when a pass to be output to a subsequent stage through the shift register is selected, the unit element delays an input signal by the delay amount of predetermined stages of the delay elements and outputs the signal to the subsequent stage, the ring oscillator generates a trigger clock having a delay amount of one or more delay elements as a period, and outputs the trigger clock to the shift register, the first decoder generates a plurality of quotient information signals in accordance with the quotient information, and outputs any one of the plurality of quotient information signals to a selection signal terminal of the multiplexer, the second decoder generates a plurality of remainder information signals in accordance with the remainder information, and outputs any one of the plurality of remainder information signals to any one of a plurality of delay elements connected in series and configuring the delay line, and a signal output from a unit element at a final stage is input to the delay line, and the delay line generates the delayed clock.

9. The semiconductor device according to claim 6, wherein the delay element is configured from an even number of inverters connected in series.

* * * * *